US008242836B2

(12) United States Patent
Sato et al.

(10) Patent No.: US 8,242,836 B2
(45) Date of Patent: Aug. 14, 2012

(54) ACOUSTIC CHARACTERISTIC CONTROL APPARATUS

(75) Inventors: Yasushi Sato, Kitakyushu (JP); Atsuko Ryu, Kitakyushu (JP)

(73) Assignee: Kyushu Institute of Technology, Kitakyushu-Shi, Fukuoka (JP)

( * ) Notice: Subject to any disclaimer, the term of this patent is extended or adjusted under 35 U.S.C. 154(b) by 5 days.

(21) Appl. No.: 13/057,896

(22) PCT Filed: Aug. 3, 2009

(86) PCT No.: PCT/JP2009/063731
§ 371 (c)(1), (2), (4) Date: Feb. 7, 2011

(87) PCT Pub. No.: WO2010/016455
PCT Pub. Date: Feb. 11, 2010

(65) Prior Publication Data

US 2011/0140770 A1 Jun. 16, 2011

(30) Foreign Application Priority Data

Aug. 8, 2008 (JP) ................................ 2008-206250

(51) Int. Cl.
*H03K 5/00* (2006.01)

(52) U.S. Cl. ....................................... 327/554; 327/552

(58) Field of Classification Search ........... 327/551–559
See application file for complete search history.

(56) References Cited

U.S. PATENT DOCUMENTS 5,945,889 A * 8/1999 Shanthi-Pavan et al. .... 333/17.1
7,492,216 B2 * 2/2009 Kurimoto et al. ............ 327/553

FOREIGN PATENT DOCUMENTS

JP 61-165800 A 7/1986
JP 7-106878 A 4/1995
JP 8-179792 A 7/1996
JP 2004-233965 A 8/2004

OTHER PUBLICATIONS

International Search Report (PCT/ISA/210) issued on Sep. 8, 2009, by Japanese Patent Office as the International Searching Authority for International Application No. PCT/JP2009/063731.

* cited by examiner

*Primary Examiner* — Dinh T. Le
(74) *Attorney, Agent, or Firm* — Buchanan Ingersoll & Rooney PC

(57) ABSTRACT

An acoustic characteristic control apparatus supplies music signal, for example, to input terminal connected to a band-pass filter and a peaking filter. In a zero-cross detection circuit, a pulse signal corresponding to a period while a signal is positive is formed. A pulse-width measuring circuit output a signal corresponding to a pulse width. Next, the output of the pulse-width measuring circuit is inputted to one comparator and another comparator. The one comparator discriminates a time when the pulse width is equal to or larger than a first setting value, and the another comparator discriminates a time when the pulse width is equal to or smaller than a second setting value. The comparator is connected to the up terminal and the down terminal of an up/down counter. The output of the up/down counter is connected to the peaking filter through the subtractor, and acoustic characteristics of the peaking filter is controlled according to the count value of the up/down counter.

6 Claims, 4 Drawing Sheets

FIG. 4C1 UP

FIG. 4C2 DOWN

ACOUSTIC CHARACTERISTIC CONTROL APPARATUS

TECHNICAL FIELD

The present invention relates to an acoustic characteristic control apparatus, particularly to a process of detecting continuation of a signal in a specific frequency range from an inputted audio signal, controlling the acoustic characteristic of the signal, and outputting the signal.

BACKGROUND ART

In the configuration of whole music, a part of the most representative climactic subject is called "climax". In the case of a song, the climax part is a part in which the voice of the singer continues for relatively long time.

On the other hand, the acoustic characteristic of a recorded music is designed so that effect can be exerted when the music is reproduced by relatively large audio equipment. Thus, there is a possibility that sufficiently effective performance may not be achieved in the case where the music is reproduced by, for example, a portable audio device, a small audio device, a vehicle-mounted audio device, or the like.

To solve such a problem, in the portable audio device and the like, the acoustic characteristic is adjusted so that the voice band of the singer of a song, for example, is intensified. However, if such intensification is constantly performed, the voice of the singer will become inconspicuous especially in the climactic climax part and therefore will become unnatural, and that can not be called a good reproduction.

On the other hand, a process has been considered in which the climax part of the music is discriminated, and the acoustic characteristic of a predetermined band is intensified only for the climax period. By performing such a process, since the acoustic characteristic of the climax part, which is originally the performance of the impressive voice, is intensified, the voice will not be unnatural, and therefore it is possible to perform effective reproduction. Conventionally researches have been done with regard to methods for discriminating the climax (see, for example, Patent Document 1). Further, methods for intensifying a specific band of music are known techniques (see, for example, Patent Document 2).

As described above, a process has been considered in which the climax part of the music is discriminated, and the acoustic characteristic of a predetermined band is intensified only for the climax period so as to perform effective reproduction. However, as a method for discriminating the climax, very large equipment is needed according to, for example, the technique disclosed in Patent Document 1, and therefore it is not easy to implement such method in the portable audio device or the like. Further, in the technique disclosed in Patent Document 1, the climax part is discriminated from the whole music, and therefore it is necessary to previously perform a discrimination process, so that such technique can not be applied to the music that is being currently played.

Patent Document 1: Japanese Unexamined Patent Application Publication No. 2004-233965

Patent Document 2: Japanese Unexamined Patent Application Publication No. Hei7-106878

DISCLOSURE OF THE INVENTION

Problems to be Solved by the Invention

It is an object of the present invention to provide a sound-reproducing system capable of discriminating continuation of a specific frequency range (for example, a voice-frequency range) on a real-time basis with a simple configuration, and performing reproduction with suitable characteristics.

Means for Solving the Problems

To achieve the aforesaid object, an acoustic characteristic control apparatus according to an aspect of the present invention includes: a pulse signal conversion section adapted to output a first pulse signal whose pulse width changes according to the waveform of an input signal; a pulse-width measuring section adapted to measure the pulse width of the first pulse signal; a first comparison section and a second comparison section, the first comparison section outputting a second pulse signal if the pulse width measured by the pulse-width measuring section is equal to or larger than a first pulse width, the second comparison section outputting a third pulse signal if the pulse width measured by the pulse-width measuring section is equal to or smaller than a second pulse width; a counter adapted to count up its count value if the second pulse signal is inputted from the first comparison section, and count down its count value if the third pulse signal is inputted from the second comparison section; and a filter whose frequency characteristic changes according to the count value of the counter, the filter being adapted to directly filter the input signal with its frequency characteristic and output the filtered input signal.

It is preferred that a filter is arranged before the pulse signal conversion section to extract the signal in a range of 1 kHz to 4 kHz, and thereby detect continuation of the voice signal so as to control the acoustic characteristic of the output.

The pulse signal conversion section outputs a signal of high level when the input signal is positive, and outputs a signal of low level when the input signal is not positive.

It is preferred that the filter is a peaking filter.

It is preferred that the filter is a high-shelf filter.

It is preferred that the filter is a low-shelf filter.

ADVANTAGES OF THE INVENTION (1) Since the up/down counter that performs up/down count with respect to the reproduced audio signal according to the frequency range, it is possible to perform control on a real-time basis by, for example, detecting continuation of the signal of the frequency band of the voice and gradually emphasizing the frequency band of the voice; and gradually stopping the emphasis if the continuation is missing.

(2) The control described in (1) is performed with a simple configuration without employing a complicated configuration such as FFT.

(3) With the configuration according to the present invention, since the control is achieved without depending on the level (i.e., the amplitude) of the audio signal, the control will not be affected by the change of the sound volume.

BEST MODES FOR CARRYING OUT THE INVENTION

An embodiment of the present invention will be described below with reference to the attached drawings.

The present invention is adapted to detect a continuous part of, for example, a voice from a reproduced signal of music or the like on a real-time basis with a simple configuration, the voice is filtered by a filter whose frequency characteristic is changed to a predetermined frequency characteristic based on the detection result. In the present invention, continuation of a voice-frequency range is detected with a simple configuration; and the climax part where the voice continues due to singing loudly, for example, is amplified. Incidentally, hereinafter the term "climax" means a continuous voice in a certain frequency band.

A voice signal can be roughly classified into consonants and vowels; and since the vowels have lager power compared with the transitional consonants, the vowels largely contribute to the transmission of the voice signal. The value of the frequency of the voice signal is called a "fundamental frequency" (or a "pitch frequency") of the voice, which determines one of the big features of the voice. Generally, the pitch frequency of men is 50~200 Hz, and the pitch frequency of women is 75~350 Hz. In the present invention, continuation of harmonic components of the pitch frequency is detected, and thereby continuation of the voice signal is detected.

A concrete circuit configuration of the embodiment of the present invention will be described below with reference to FIG. 1. Further, concrete operation of the circuit configuration shown in FIG. 1 will be explained below with reference to FIGS. 2A to 5C.

As shown in FIG. 1, a PCM (Pulse Code Modulation) encoded signal of music, for example, is supplied to an input terminal 1. The input terminal 1 is connected to a band-pass filter (BPF) 2 and a peaking filter 10.

The band-pass filter 2 allows the harmonic components of a pitch frequency of about 50 Hz to 350 Hz, which are the frequency band of the voice signal, to pass through. The following low-pass filter (LPF) 3 attenuates signals of frequency bands much included in the audio signal outputted from musical instruments and the like.

The frequency characteristic of the band-pass filter 2 is shown by curve $X_1$ in FIG. 2A, and the frequency characteristic of the low-pass filter 3 is shown by curve $X_2$ in FIG. 2A. The combined characteristic of the frequency characteristic of the band-pass filter 2 and the frequency characteristic of the low-pass filter 3 is shown in FIG. 2B. The combined characteristic shown in FIG. 2B is suitable for extracting the harmonic components of the voice signal of human singing voice, and the harmonic components of the voice signal of human singing voice are extracted by the two filters.

The band-pass filter 2 is configured by, for example, a secondary IIR filter, and the cutoff frequency and Q value of the band-pass filter 2 are respectively: fc=4 kHz, Q=0.707. The low-pass filter 3 is configured by, for example, a primary IIR filter, and the cutoff frequency of the low-pass filter 3 is: fc=300 Hz. With such a configuration, frequency range of 1~4 kHz, which is much included in the harmonic components of the voice signal is extracted.

The output signal from the low-pass filter 3 has a waveform shown in FIG. 3A, for example, which oscillates between positive direction and negative direction with a reference zero level as the center, and is much included in the harmonic components of the pitch frequency of the voice signal.

The output of the low-pass filter 3 is connected to the input of the zero-cross detection circuit 4. In the zero-cross detection circuit 4, the output of the low-pass filter 3 is compared with the zero level, and a pulse signal, as shown in FIG. 3B, is formed so that high levels represent periods in which the extracted signal is positive.

In the climax part of the music, the continuous time while the voice is phonated tends to be long. The pulse signal from the zero-cross detection circuit is a pulse signal of the frequency band of the harmonic components of the voice signal, and in the climax part, the pulse of the frequency band continues. While in the part other than the climax part, the pulse of the frequency band is often not continuously generated.

The output of the zero-cross detection circuit 4 (a first pulse signal) is connected to the input of a pulse-width measuring circuit 5 that measures the positive pulse width. The pulse-width measuring circuit 5 outputs a signal corresponding to the pulse width by, for example, measuring the time between the rising edge and the falling edge of the positive pulse signal. To be specific, the pulse-width measuring circuit 5 counts the time with a counter and output a count value corresponding to the pulse width. Further, the output signal of the pulse-width measuring circuit 5 is inputted to a comparator 6 and a comparator 7.

In the comparator 6, a time when the pulse width is equal to or larger than a first setting value a is discriminated, and a pulse signal (a second pulse signal) is outputted; while in the comparator 6, a time when the pulse width is equal to or smaller than a second setting value b is discriminated, and a pulse signal (a third pulse signal) is outputted. Herein, the setting value a is set to be larger than the setting value b, and a dead zone is arranged between the setting value a and the setting value b.

The output of the comparator 6 is connected to an up terminal of an up/down counter 8, and output of the comparator 7 is connected to a down terminal of the up/down counter 8.

In the up/down counter 8, when a pulse signal is inputted to the up terminal (i.e., when the pulse width of the pulse inputted to the comparator 6 is larger than the first setting value a), a pulse is generated, so that an up count is performed; while when a pulse signal is inputted to the down terminal (i.e., when the pulse width of the pulse inputted to the comparator 7 is smaller than the second setting value b), a pulse is generated, so that a down count is performed.

When a pulse having a pulse width equal to or larger than the setting value a is continuing, it shows that the signal of the harmonic components of the voice signal is continuing (i.e., it shows that the climax part of the music, for example, is continuing); while when a pulse having a pulse width equal to or smaller than the setting value b is continuing, it shows that the part other than the climax part is continuing. It is clear from the descriptions above that, in the up/down counter 8, the count value becomes large in the climax part of music for example, and the count value becomes small in the part other than the climax part.

The original signal (the PCM encoded signal of the music) supplied to the input terminal 1 is sampled at 44.1 kHz. After passing through the filter, the sampled PCM signal is converted into a pulse signal and inputted to the pulse-width measuring circuit 5. Further, the pulse-width measuring circuit 5 measures the pulse width by counting the periods while the input pulse signal is in high level with a predetermined clock. The measurement interval is set to 10 ms so that the pulse width of the original signal having a frequency of 50 Hz or lower is not measured.

The output of the up/down counter 8 is inputted to one side of a subtractor 9, in which the positive output signal of the up/down counter 8 is converted into a positive and negative signal. The positive and negative signal outputted by the subtractor 9 is inputted to the peaking filter 10. The output of the peaking filter 10 is connected to an output terminal 11.

The output of the up/down counter 8 is connected to the peaking filter 10 through the subtractor 9, and the frequency characteristic (transmission characteristic) of the peaking filter 10 is controlled according to the count value of the up/down counter 8.

The above will be explained below with reference to FIGS. 4A, 4B, 4C1, 4C2 and 4D. FIG. 4A shows the output signal of the low-pass filter 3, FIG. 4B shows the output signal of the zero-cross detection circuit 4 (the first pulse signal), 4C1 shows the output signal of the comparator 6 (the second pulse signal), 4C2 shows the output signal of the comparator 7 (the third pulse signal), and FIG. 4D shows the output signal of the up/down counter 8.

As shown on the left side of FIG. 4A, when a waveform indicating the voice signal of the climax part is detected, the pulse signal from the zero-cross detection circuit 4 will become a signal having relatively large pulse width as shown on the left side of FIG. 4B. Thus, the pulse signal shown in FIG. 4C1 is inputted from the comparator 6 to the up/down counter 8, so that the count value of the up/down counter 8 becomes larger as shown on the left side of FIG. 4D.

On the other hand, as shown on the left side of FIG. 4A, when a waveform indicating the audio signal of the part other than the climax part is detected, the pulse signal from the zero-cross detection circuit 4 will become a signal having a small pulse width as shown on the right side of FIG. 4B, and therefore the pulse signal shown in FIG. 4C2 is inputted from the comparator 7 to the up/down counter 8, so that the count value of the up/down counter 8 becomes smaller as shown on the right side of FIG. 4D.

Thus, the count value of the up/down counter 8 corresponds to both the climax part and the part other than the climax part. Incidentally, the up/down counter 8 has an output of 5 bits, for example; and the count value is set to 0~31, and count will not be performed if the count value exceeds 31 or becomes smaller than 0.

The count value (0~31) of the up/down counter 8 is connected to the subtractor 9, and "16", which is the intermediate value of the variation width (=32) of the count value, is subtracted. Thereby the count value (0~31) is converted into a control value (−16~+15). The controlling value (−16~+15) is supplied to a control terminal of the peaking filter 10.

Further, the peaking filter 10 has characteristics expressed by the following formula (1), and the frequency characteristic (acoustic characteristic) graph of the peaking filter 10 is shown in FIG. 5A.

[Formula 1]

$$H(s) = \frac{s^2 + \frac{A}{Q} \times s + 1}{s^2 + \frac{1}{AQ} \times s + 1} \tag{1}$$

In formula (1), when controlling value A, the height of the mid-frequency portion of the frequency characteristic graph shown in FIG. 5A is changed in positive and negative directions. Further, when controlling value Q, the steepness of the mid-frequency portion of the frequency characteristic graph shown in FIG. 5A is changed.

In the configuration of the embodiment shown in FIG. 1, in the peaking filter 10 having the characteristics expressed by formula (1), for example, the value A is controlled using the control value (−16~+15). Thus, a control is performed so that, for example, in the climax part of the music, the mid-frequency portion of the frequency band of the voice signal is intensified, while in the part other than the climax part, the mid-frequency portion of the frequency band of the voice signal is attenuated.

Thus, with the aforesaid embodiment, the frequency band of the part equivalent to the singing (voice) part in the climax part of the music is intensified so that the music becomes exciting, while the frequency band of the part equivalent to the singing part in the part other than the climax part is attenuate so that the music becomes flat, and thereby the reproduced voice signal is well-modulated, so that it is possible to well reproduce the voice signal.

<Emphasis of Frequencies Out of Voice-Frequency Range>

Further, instead of the peaking filter 10, a high-shelf filter or a low-shelf filter can be used according to the content of the inputted music. Incidentally, the high-shelf filter is used as a treble controller in audio equipment, and the low-shelf filter is used as a bass controller in audio equipment.

The high-shelf filter has characteristics expressed by the following formula (2), and the frequency characteristic graph of the high-shelf filter is shown in FIG. 5B.

[Formula 2]

$$H(s) = A\frac{As^2 + \frac{\sqrt{A}}{Q} \times s + 1}{s^2 + \frac{\sqrt{A}}{Q} \times s + A} \tag{2}$$

In formula (2), when controlling value A, the height of the shoulder portion of the high-frequency portion of the frequency characteristic graph shown in FIG. 5B is changed in positive and negative directions. Further, when controlling value Q, the steepness of the shoulder portion of the high-frequency portion of the frequency characteristic graph shown in FIG. 5A is changed. In the aforesaid embodiment, in the high-shelf filter having the characteristics expressed by formula (2), for example, the value A is controlled using the control value (−16~+15).

Thus, a control can be performed so that, for example, in the part where the voice continues (i.e., the climax part), the high-frequency portion is intensified, while in the part other than the climax part, the high-frequency portion of the voice signal is attenuated.

Further, the low-shelf filter has characteristics expressed by the following formula (3), and the frequency characteristic graph of the low-shelf filter is shown in FIG. 5C.

[Formula 3]

$$H(s) = A\frac{s^2 + \frac{\sqrt{A}}{Q} \times s + A}{As^2 + \frac{\sqrt{A}}{Q} \times s + 1} \tag{3}$$

In formula (3), when controlling value A, the height of the shoulder portion of the low-frequency portion of the frequency characteristic graph shown in FIG. 5C is changed in positive and negative directions. Further, when controlling value Q, the steepness of the shoulder portion of the low-frequency portion of the frequency characteristic graph shown in FIG. 5C is changed. In the aforesaid embodiment, in the low-shelf filter having the characteristics expressed by formula (3), for example, the value A is controlled using the control value (−16~+15).

APPLICATIONS OF EMBODIMENT

Thus, with the acoustic characteristic control apparatus and the method thereof, it is possible to constantly well reproduce the voice signal with a simple configuration by, for example, discriminating the climax part, in which the voice signal continues, from the part other than the climax part of the music, and intensifying or attenuating the frequency characteristic of the inputted voice signal according to information obtained based on the discrimination. Further, at this time, the discrimination of the climax part of the music can be performed on the music substantially at the same time while the music is being played, and therefore the present invention can be applied to the music received from, for example, broadcast.

A process of detecting the climax part of the music by detecting that the voice is continuously outputted has been described above. However, the process of controlling the characteristics by detecting continuation of the voice not only can be used to detect the climax part, but also can be used to detect continuation of voice when an announcer reads news loudly or the like, so that the acoustic characteristic suitable to the output of the voice can be obtained.

<Detection of Continuation of Signal of Frequency Ranges Out of Voice-Frequency Range>

In the above description, continuation of the signal of the voice-frequency range is detected; however, it is possible to detect continuation of the signal of the frequency ranges out of the voice-frequency range by changing the pulse width setting values a, b to the filters 2, 3 and comparators 6, 7.

For example, in music, it is possible to detect continuation of the signal of a low-frequency range, and change the acoustic characteristic of the output to the one that emphasizes the low-frequency range.

Further, in music, it is possible to detect continuation of the signal of a high-frequency range, and change the acoustic characteristic of the output to the one that emphasizes the high-frequency range.

<Configuration by Signal Processing Processor>

Further, in the present invention, each function of the block diagram shown in FIG. 1 can be achieved by a signal processing processor, and is a function capable of being installed using computer software.

ADVANTAGES OF EMBODIMENT

The aforesaid embodiment of the present invention has the following advantages.

(1) It is possible to perform control on a real-time basis by, when the signal of the frequency band of the voice or the like in the reproduced audio signal continues, gradually emphasizing the frequency band; and, when the continuation is missing, gradually stopping the emphasis.

(2) The control described in (1) is performed with a simple configuration without employing a complicated configuration such as FFT.

(3) Since the control is achieved without depending on the level (i.e., the amplitude) of the audio signal, the control will not be affected by the change of the sound volume.

BRIEF DESCRIPTION OF DRAWINGS

FIGS. 4A, 4B, 4C1, 4C2 and 4D are graphs for explaining the function of each section shown in FIG. 1.

Figure 1:
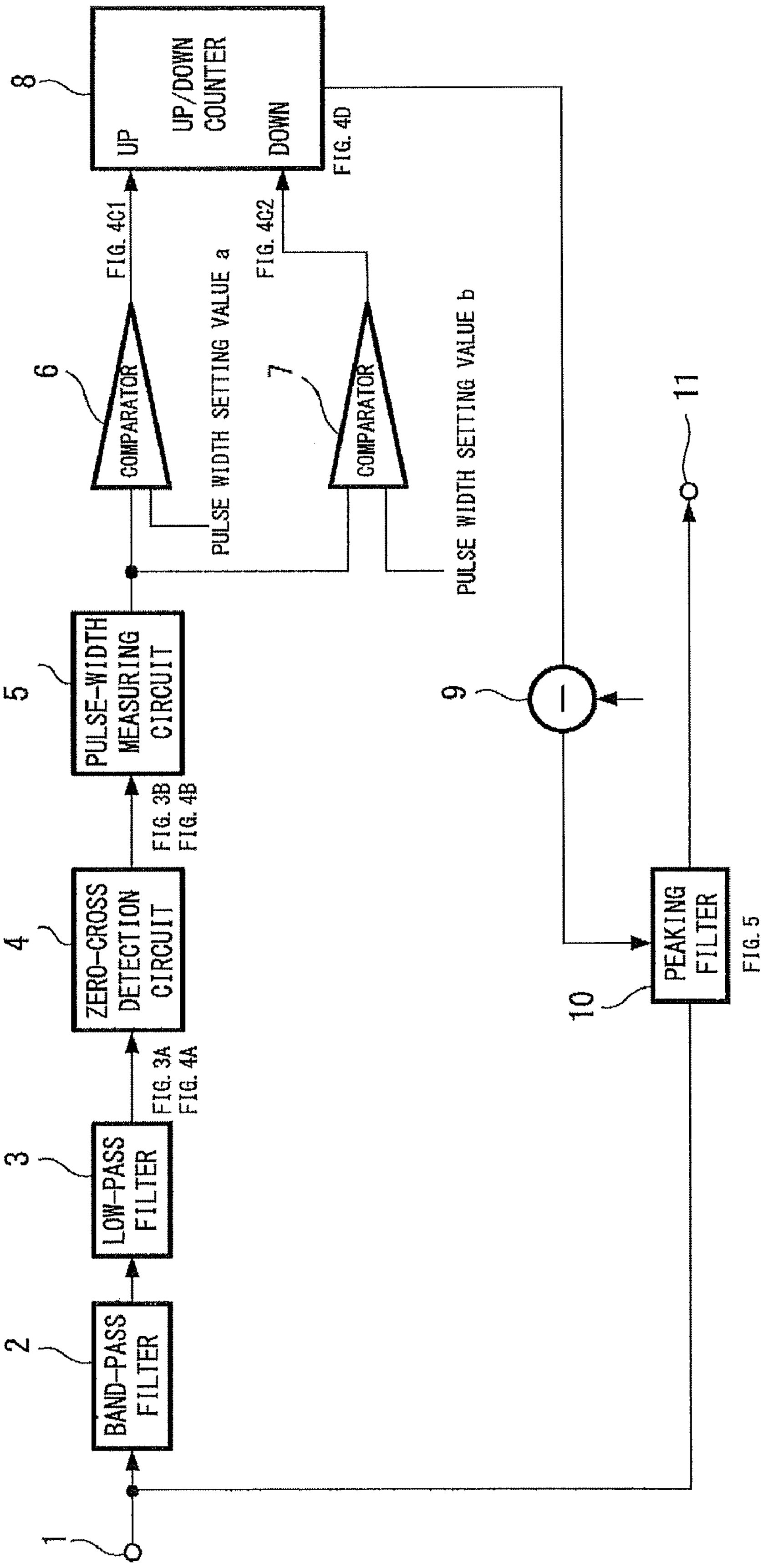
FIG. 1 is a block diagram showing the configuration of an embodiment according to the present invention.
Figure 2A:
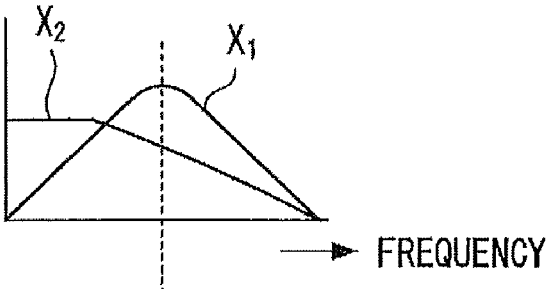
FIGS. 2A and 2B are graphs showing the characteristics of filters 2, 3 shown in FIG. 1.
Figure 2B:
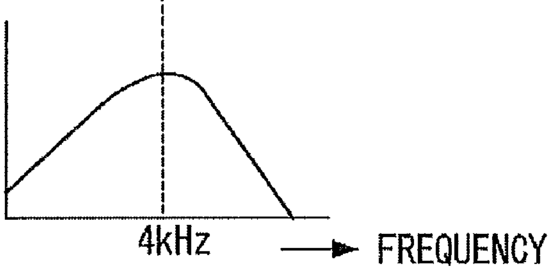
Figure 3A:
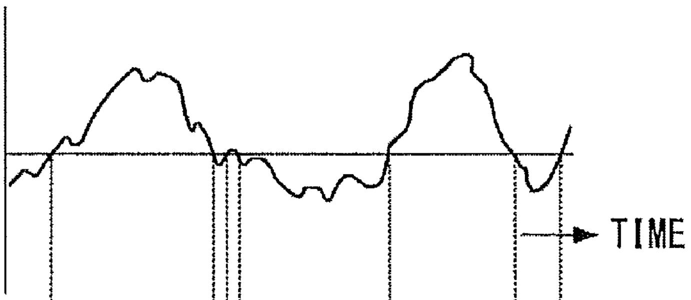
FIGS. 3A and 3B are views for explaining a zero-cross detection circuit 4 shown in FIG. 1.
Figure 3B:
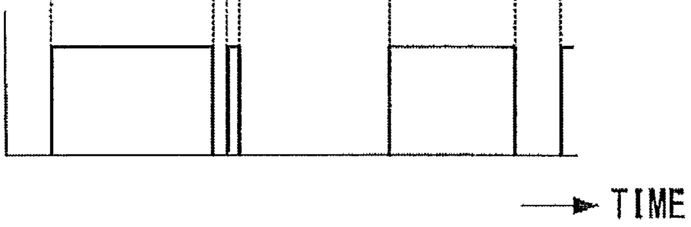
Figures 4A, 4B, 4D:
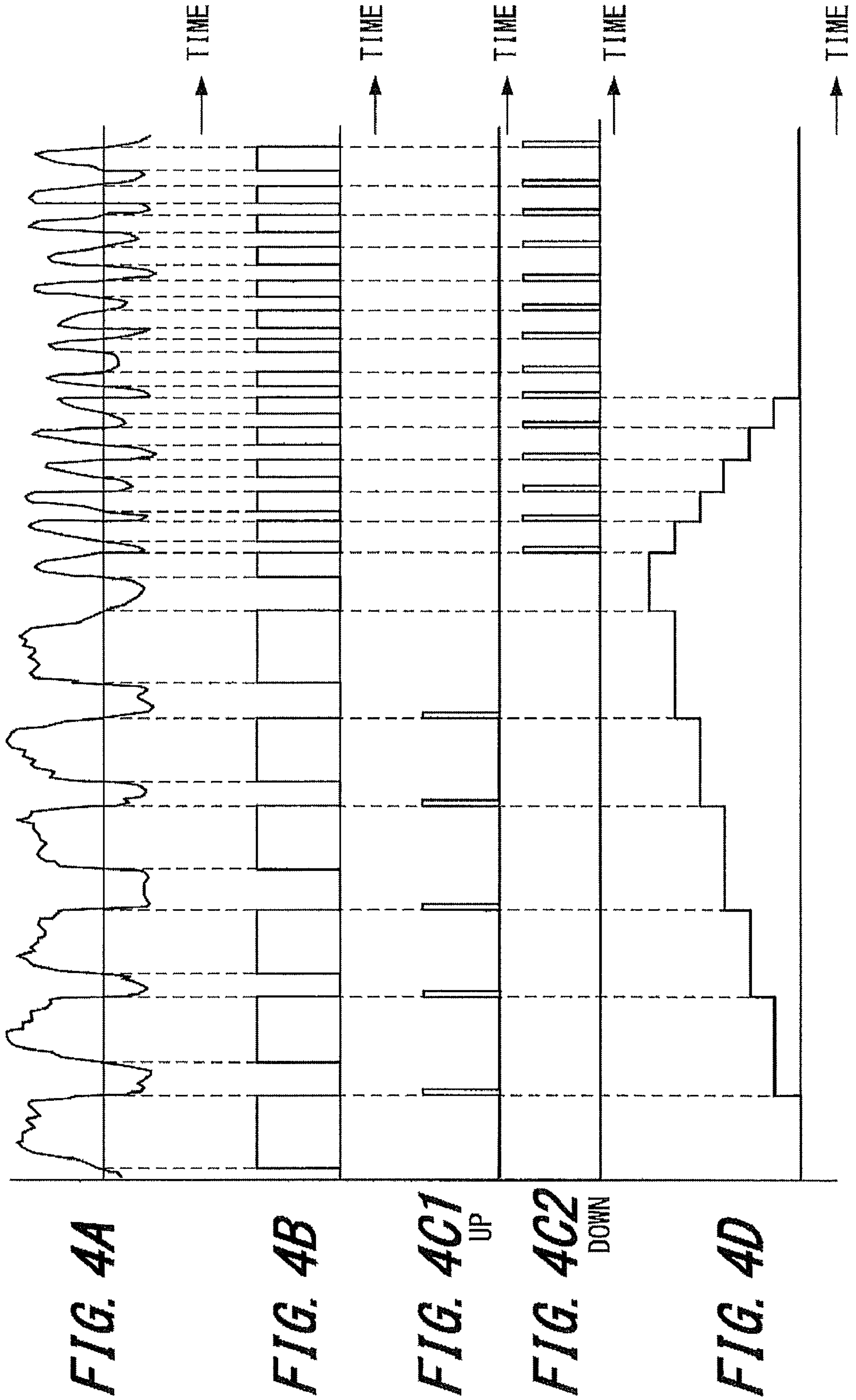
Figure 5A:
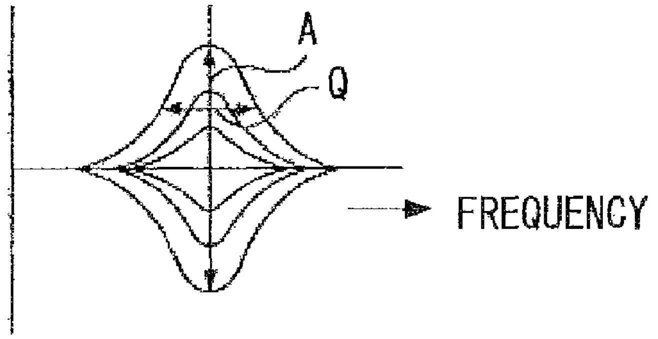
FIGS. 5A, 5B and 5C are graphs showing the characteristic of a peaking filter shown in FIG. 1.
Figure 5B:
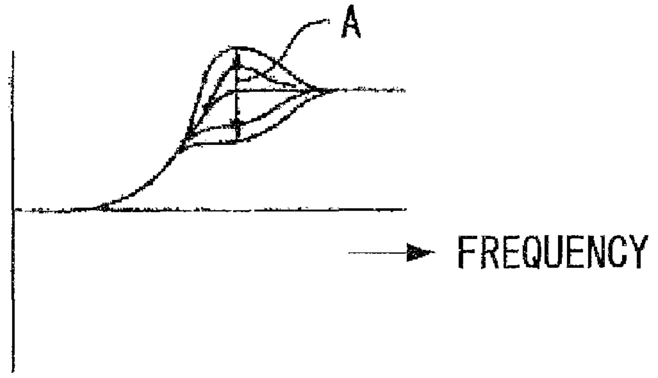
Figure 5C:
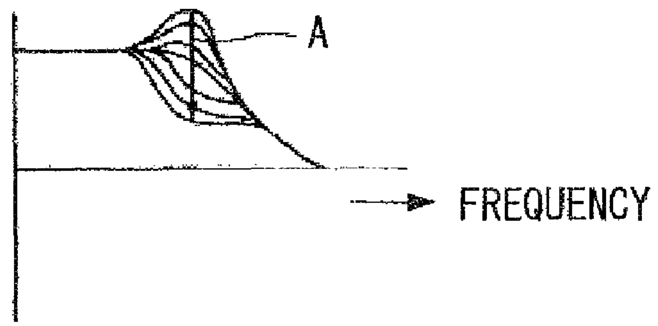

The invention claimed is:

1. An acoustic characteristic control apparatus comprising:

a pulse signal conversion section adapted to output a first pulse signal whose pulse width changes according to the waveform of an input signal;

a pulse-width measuring section adapted to measure the pulse width of the first pulse signal;

a first comparison section and a second comparison section, the first comparison section outputting a second pulse signal if the pulse width measured by the pulse-width measuring section is equal to or larger than a first pulse width, the second comparison section outputting a third pulse signal if the pulse width measured by the pulse-width measuring section is equal to or smaller than a second pulse width;

a counter adapted to count up its count value if the second pulse signal is inputted from the first comparison section, and count down its count value if the third pulse signal is inputted from the second comparison section; and a filter whose frequency characteristic changes according to the count value of the counter, the filter being adapted to directly filter the input signal with its frequency characteristic and output the filtered input signal.

2. The acoustic characteristic control apparatus according to claim 1, further comprising a filter arranged before the pulse signal conversion section, the filter being adapted to extract the signal in a range of 1 kHz to 4 kHz.

3. The acoustic characteristic control apparatus according to claim 1, wherein the pulse signal conversion section outputs a signal of high level when the input signal is positive, and outputs a signal of low level when the input signal is not positive.

4. The acoustic characteristic control apparatus according to claim 1, wherein the filter is a peaking filter.

5. The acoustic characteristic control apparatus according to claim 1, wherein the filter is a high-shelf filter.

6. The acoustic characteristic control apparatus according to claim 1, wherein the filter is a low-shelf filter.

* * * * *